(12) United States Patent
Doan et al.

(10) Patent No.: US 6,340,624 B1
(45) Date of Patent: Jan. 22, 2002

(54) METHOD OF FORMING A CIRCUITRY ISOLATION REGION WITHIN A SEMICONDUCTIVE WAFER

(75) Inventors: Trung Tri Doan; Mark Durcan, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/518,558

(22) Filed: Mar. 3, 2000

Related U.S. Application Data

(63) Continuation of application No. 09/311,914, filed on May 14, 1999, now Pat. No. 6,100,162.

(51) Int. Cl.[7] .............................................. H01L 21/76
(52) U.S. Cl. ...................... 438/433; 438/425; 438/427; 438/449
(58) Field of Search .............................. 438/433, 449, 438/439, 424, 425, 426, 427

(56) References Cited

U.S. PATENT DOCUMENTS

| 4,570,325 A | 2/1986 | Higuchi ........................ 29/576 |
| 4,584,055 A | 4/1986 | Kayanuma et al. .......... 156/628 |
| H204 H | 2/1987 | Oh et al. ..................... 156/648 |
| 5,118,636 A | 6/1992 | Hosaka ......................... 437/35 |
| 5,668,044 A | 9/1997 | Ohno ......................... 438/433 |
| 5,780,353 A | 7/1998 | Omid-Zohoor ............. 438/433 |
| 5,925,811 A | 7/1999 | Okabe et al. ................ 257/341 |
| 5,930,650 A | 7/1999 | Chung et al. ............... 438/448 |

*Primary Examiner*—Long Pham
(74) *Attorney, Agent, or Firm*—Wells, St. John, Roberts, Gregory & MAtkin, P.S.

(57) ABSTRACT

A method of forming a circuitry isolation region within a semiconductive wafer comprises defining active area and isolation area over a semiconductive wafer. Semiconductive wafer material within the isolation area is wet etched using an etch chemistry which forms an isolation trench proximate the active area region having lowestmost corners within the trench which are rounded. Electrically insulating material is formed within the trench over the previously formed round corners. In accordance with another aspect, the semiconductive wafer material within the isolation area is etched using an etch chemistry which is substantially selective relative to semiconductive wafer material within the active area to form an isolation trench proximate the active area region. In accordance with still another aspect, a method of forming a circuitry isolation region within a semiconductive wafer comprises masking an active area region over a semiconductive wafer. The active area region is provided with an impurity doping of a first conductivity type. An impurity of a second conductivity type is provided within the semiconductive wafer proximate the masked active area region. Second conductivity type provided semiconductive wafer material is substantially selectively etched relative to first conductivity type provided semiconductive wafer material forming a trench proximate the active area region. Electrically insulating material is formed within the trench.

52 Claims, 4 Drawing Sheets

__US 6,340,624 B1__

METHOD OF FORMING A CIRCUITRY ISOLATION REGION WITHIN A SEMICONDUCTIVE WAFER

RELATED PATENT DATA

This patent resulted from a continuation application of U.S. patent application Ser. No. 09/311,914, filed May 14, 1999, entitled "Method of Forming A Circuitry Isolation Region Within A Semiconductor Wafer", naming Trung Tri Doan and Mark Durcan as inventors, and which is now U.S. Pat. No. 6,100,162.

TECHNICAL FIELD

This invention relates to methods of forming a circuitry isolation regions within semiconductive wafer.

BACKGROUND OF THE INVENTION

Integrated circuitry is typically fabricated on and within semiconductor substrates, such a bulk monocrystalline silicon wafers. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Electrical components fabricated on substrates, and particularly bulk semiconductor wafers, are isolated from adjacent devices by insulating materials, such as insulating oxides. One isolation technique comprises trench isolation, whereby trenches are cut into a substrate and are subsequently filled with insulating oxide. Typical prior art problems associated with such isolation is described with reference to FIGS. 1–3.

Referring first to FIG. 1, a semiconductor wafer fragment 10 is comprised of a bulk monocrystalline silicon wafer having light background p-type doping of, for example, an average concentration of $1 \times 10^{13}$ ions/cm$^3$. A pad oxide layer 14 has been formed over wafer 12, and an oxidation masking layer 16 (typically $Si_3N_4$) is formed thereover. Layers 16 and 14 have been patterned as shown whereby the illustrated masking blocks overlie desired active area regions of the semiconductor wafer, and the exposed areas proximate thereto will constitute isolation regions to be formed.

Referring to FIG. 2, wafer fragment 10 is subject to a conventional dry etch chemistry, with or without plasma, which is principally fluorine-based, utilizing example components of one or more of $CHF_3$, $CF_4$ and $C_2HF_5$. Such chemistry is selective to etch semiconductor wafer material 12 uniformly selective relative to masking layers 16 and 14, and as well has a highly desired degree of anisotropy to produce the illustrated trenches 18 having substantially straight sidewalls 20. Unfortunately, such etching also undesirably produces very sharp corners 22 at the lowestmost corners within trench 18.

Referring to FIG. 3, wafer 10 has been subjected to suitable wet oxidation conditions to form oxide isolation regions 24, with layers 16 and 14 having been subsequently removed. Unfortunately, the sharp corners 22 formed by the above or other etchings undesirably create high electric fields in these locations, and produce other adverse loading effects in the finished circuitry which is detrimental to circuit operation. Accordingly, it would be desirable to provide methods which enable production of trench recessed isolation material which do not require S sharp corners.

SUMMARY OF THE INVENTION

In accordance with but one aspect of the invention, a method of forming a circuitry isolation region within a semiconductive wafer comprises defining active area and isolation area over a semiconductive wafer. Semiconductive wafer material within the isolation area is wet etched using an etch chemistry which forms an isolation trench proximate the active area region having lowestmost corners within the trench which are rounded. Electrically insulating material is formed within the trench over the previously formed round corners. In accordance with another aspect, the semiconductive wafer material within the isolation area is etched using an etch chemistry which is substantially selective relative to semiconductive wafer material within the active area to form an isolation trench proximate the active area region.

In accordance with still another aspect, a method of forming a circuitry isolation region within a semiconductive wafer comprises masking an active area region over a semiconductive wafer. The active area region is provided with an impurity doping of a first conductivity type. An impurity of a second conductivity type is provided within the semiconductive wafer proximate the masked active area region. Second conductivity type provided semiconductive wafer material is substantially selectively etched relative to first conductivity type provided semiconductive wafer material forming a trench proximate the active area region. Electrically insulating material is formed within the trench.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 4:
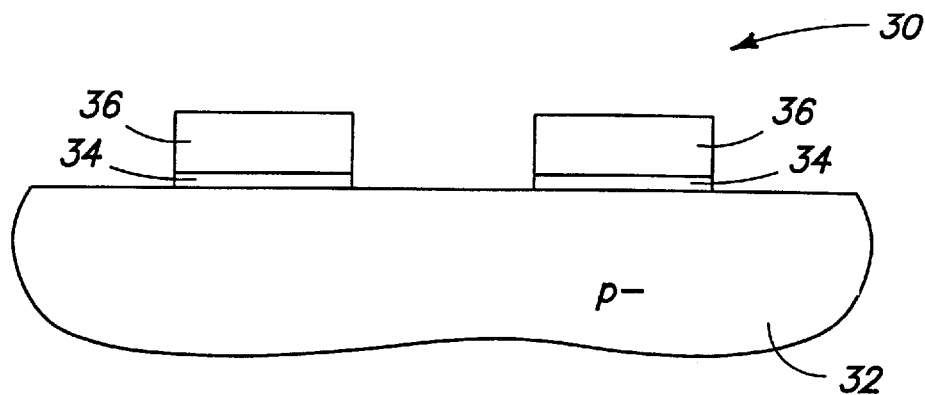
FIG. 4 is a diagrammatic sectional view of a semiconductor wafer fragment at one processing step in accordance with the invention.

Referring to FIG. 4, a semiconductor wafer fragment at a processing step in accordance with one aspect of the invention is indicated generally with reference numeral 30. Such preferably comprises a bulk semiconducive substrate 32, preferably in the form of a monolithic wafer predominately comprising monocrystalline silicon. Wafer material 32 is provided with an impurity doping of a first conductivity type of either "n" or "p". In the illustrated example, p-type doping is indicated, with an example concentration being $1\times10^{13}$ ions/cm$^3$. A pad oxide layer 34 and a masking material layer 36 (i.e., $Si_3N_4$) have been provided over wafer substrate 32 and subsequently patterned. The wafer material beneath layers 34 and 36 will constitute active area regions on the semiconductive wafer, whereas those portions of wafer material 32 not covered by layers 34 and 36 will constitute isolation regions over semiconductive wafer 32. Such provides but one example of defining active area and isolation area over a semiconductive wafer.

Figure 5:
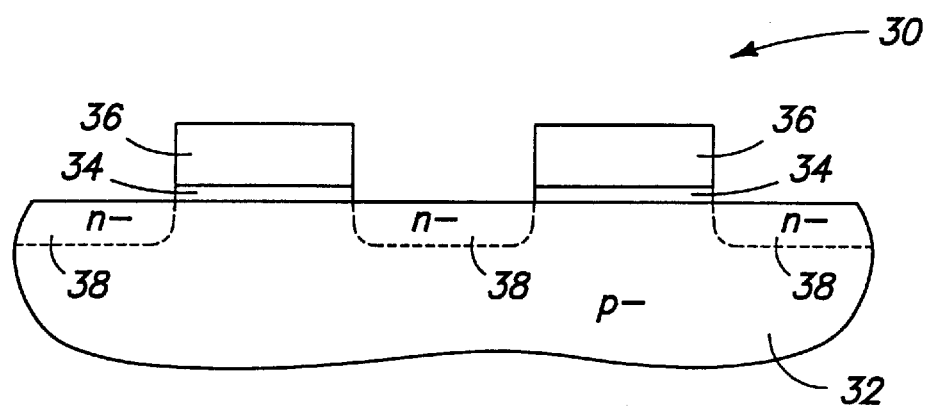
FIG. 5 is a view of the FIG. 4 wafer fragment at a processing: step subsequent to that shown by FIG. 4.

Referring to FIG. 5, an impurity of a second conductivity type is provided within semiconductive wafer material 32 proximate the active area regions masked by layers 34 and 36, forming doped regions 38. In the illustrated example, the second conductivity type is "n" where the first conductivity type is "p". This relationship can be reversed. The preferred method by which such second conductivity type impurity is provided is ion implanting to a dose greater than or equal to $1\times10^{14}$ ions/cm$^2$, with a range of from $1\times10^{14}$ ions/cm$^2$–$1\times10^{15}$ ions/cm$^2$ being a preferred range, and with $5\times10^{14}$ ions/cm$^2$ being a specific example. The energy selected in combination with the molecular weight of the implanted species will determine the depth of the implant. An example for ultimate shallow trench isolation (i.e., trench formation to depths less than 1 micron), and using phosphorus (an n-type material), is 100 keV to provide a peak concentration implant of approximately 3,000 Angstroms from the surface of semiconductive material 32.

The wafer is subsequently preferably annealed at a temperature of least about 800° C. to increase selectivity in an etch to be described below. A specific example activation anneal is at 1000° C. for from 5 to 10 seconds.

Figure 6:
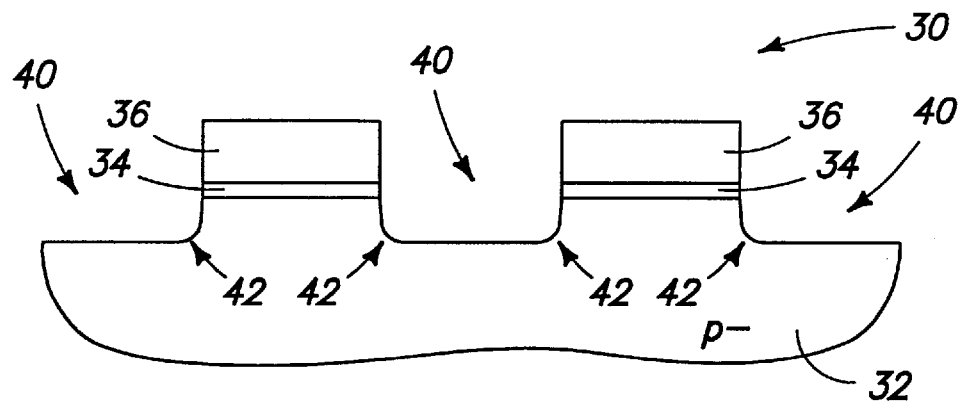
FIG. 6 is a view of the FIG. 4 wafer fragment at a processing step subsequent to that shown by FIG. 5.

Referring to FIG. 6, semiconductive wafer material within the isolation areas (i.e., regions 38) is etched using an etch chemistry which is substantially selective relative to semiconductive wafer material within the active area (i.e., that substrate material beneath layers 34 and 36;) to form isolation trenches 40 proximate the active area regions. In the illustrated example, selectivity in the etching is achieved by choosing etching chemistry substantially selective to etch the impurity doped wafer material within the isolation area relative to the different impurity doped wafer material within the active area. In the context of this document, "substantially selective", is intended to mean a removal rate of one material relative to another of at least 3:1. Chemistry is preferably chosen to provide a selectivity of at least 10:1, and even more preferably much greater.

Where the semiconductor wafer comprises silicon and selectivity is to be achieved at least partially based upon different "p" and "n" type dopings, a preferred etching will comprise wet etching using a solution comprising $HNO_3$ and HF in a volumetric ratio of at least 15:1 of one to the other depending upon the material being etched. Selectivity in removal of 100:1 can be achieved with such chemistry. For example where the first conductivity type is "p" and the second conductivity type is "n" as depicted in the Figures, the wet etch chemistry preferably has a volumetric ratio of at least 15:1 of $HNO_3$ to HF. An example etch would include a volumetric ratio of 19:1 with the etching being conducted at 50° C. and atmospheric pressure. Greater ratios, such as by way of example only, 20:1 and 40:1, could also be utilized.

The relationship is preferably reversed where the first conductivity type material is "n" and the second conductivity type material is "p", with exemplary temperatures and pressures remaining the same. In otherwords, for etching p-type silicon material substantially selective relative to n-type semiconductive material, the volumetric ratio is preferably at least 15:1 of HF to $HNO_3$.

Figure 1:
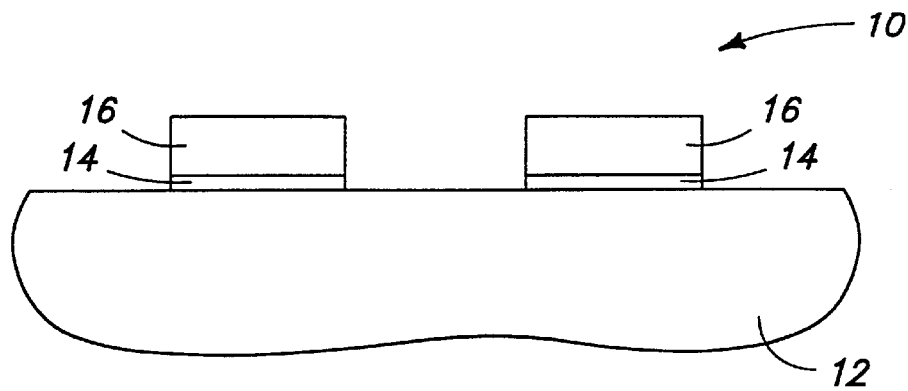
FIG. 1 is a diagrammatic sectional view of prior art semiconductive wafer fragment, and discussed in the "Background" section above.
Figure 2:
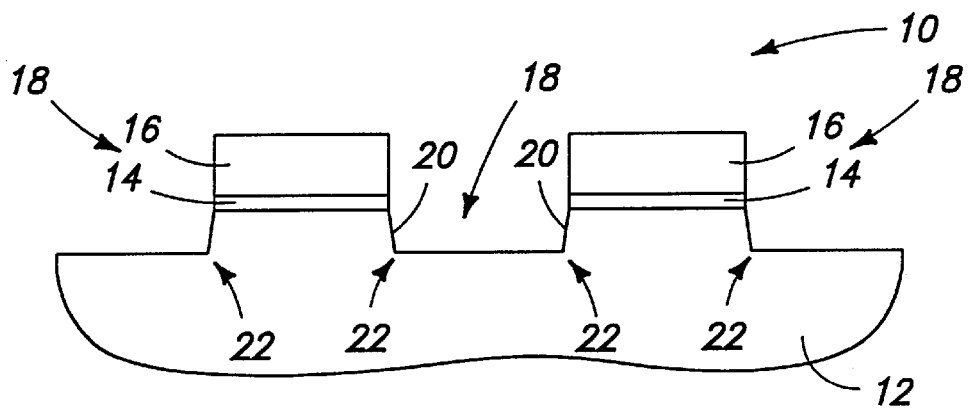
FIG. 2 is a view of the prior art FIG. 1 wafer fragment at a prior art processing step subsequent to that shown by FIG. 1.
Figure 3:
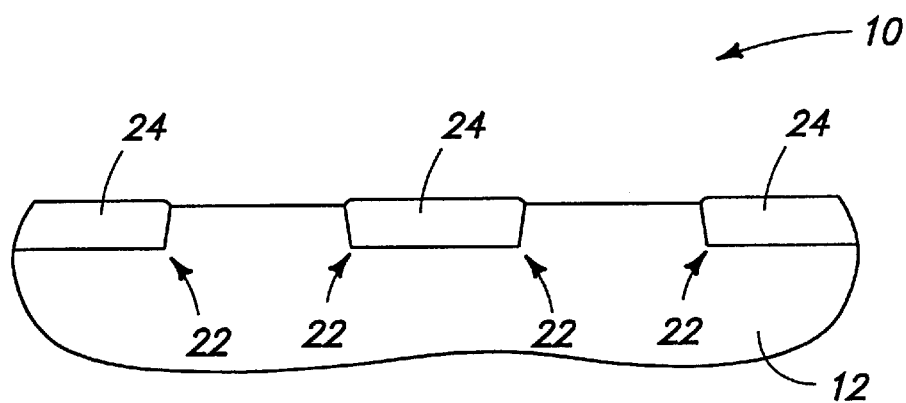
FIG. 3 is a view of the prior art FIG. 1 wafer fragment at a prior art processing step subsequent to that shown by FIG. 2.

Regardless, a goal of the selective etching is to produce isolation trenches 40 having lowestmost corners 42 therewithin which are more round in comparison to the sharp or jagged corners produced by the typical dry etching of the above-described FIGS. 1–3 prior art. Subsequently, electrically insulating material (such as $SiO_2$) is formed within the trenches. A first example process for doing so is described with reference to FIG. 7. Wafer 30 has been exposed to conventional LOCOS conditions to produce trench recessed $SiO_2$ oxide regions 44. Layers 36 and 34 are subsequently stripped (not shown) producing oxide isolated substrate areas ready for subsequent processing. Lowestmost corners 42 of the trench recessed oxide are considerably more round, thus reducing creation of undesired high electric fields and other loading effects which can adversely affect circuitry operation within the active areas.

Figure 7:
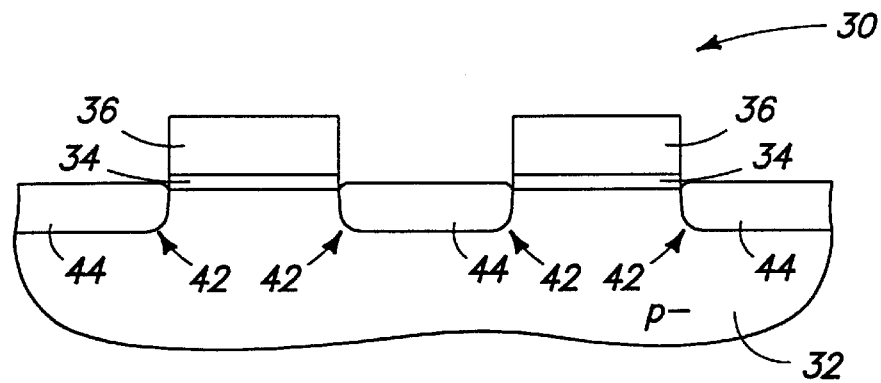
FIG. 7 is a view of the FIG. 4 wafer fragment at a processing step subsequent to that shown by FIG. 6.

An alternate processing to that depicted by FIG. 7 would be to strip layers 34 and 36 after formation of trenches 40, and subsequently deposit a silicon dioxide layer over the wafer. The silicon dioxide layer would subsequently be planarized to produce isolated oxide regions within the trenches. In either event, the FIGS. 4–7 embodiment contemplates formation of trenches 40 while masking layer 36 and masking layer 34 are in place.

Figure 8:
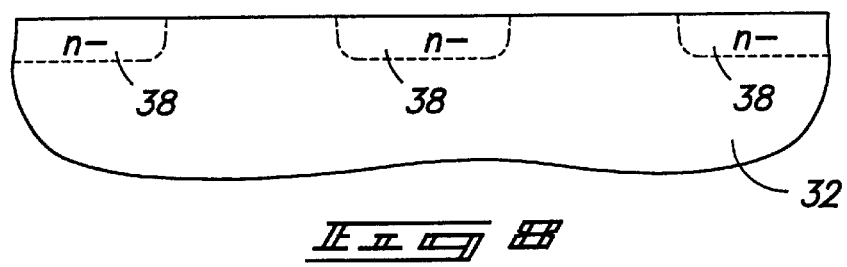
FIG. 8 is a view of the FIG. 4 wafer fragment at an alternate processing step to that shown by FIG. 7.

FIGS. 8–11 provide an alternate example embodiment whereby the substantially selective etching occurs while the active area region is unmasked by said masking layers, and preferably unmasked by any other layer. Like numerals from the FIGS. 4–7 embodiment have been utilized where appropriate, with differences being indicated by the suffix "a" or with different numerals. FIG. 8 depicts an alternate processing step subsequent to that depicted by FIG. 5 of the first-described embodiment. Here, layers 34 and 36 have been stripped from the wafer.

Figure 9:
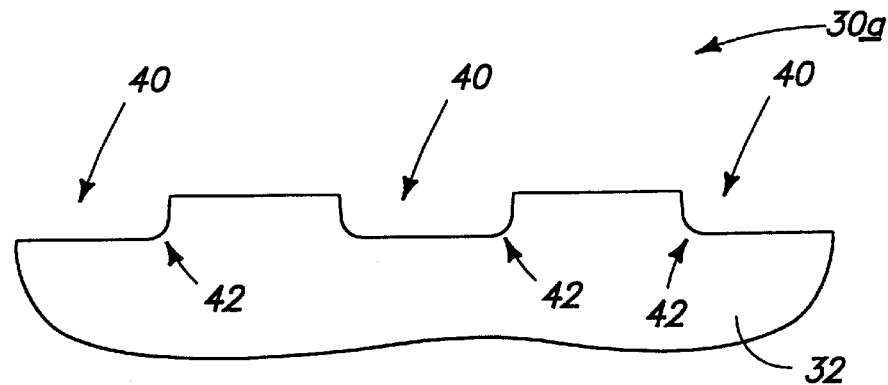
FIG. 9 is a view of the FIG. 4 wafer fragment at a processing step subsequent to that shown by FIG. 8.

Referring to FIG. 9, the above-described wet etching is conducted to produce trenches 40 ideally having rounded corners 42. Accordingly in such embodiment, the active area regions are totally unmasked during such etching. Alternately, masking layer 36 could be stripped substantially selective relative to pad oxide layer 32 and silicon of wafer 32, with the pad oxide remaining over the active area regions during such etching (not shown).

Figure 10:
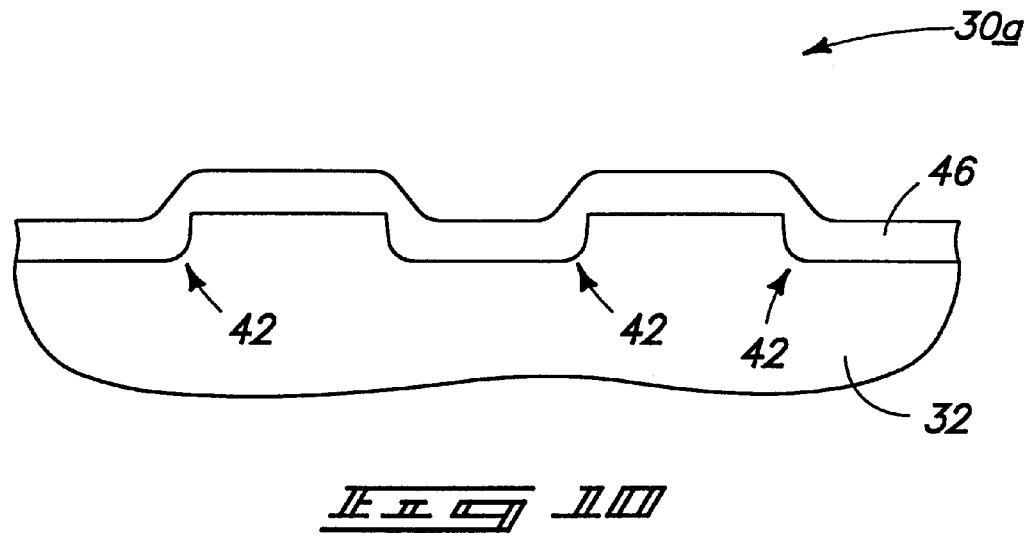
FIG. 10 is a view of the FIG. 4 wafer fragment at a processing step subsequent to that shown by FIG. 9.

Referring to FIG. 10, a layer 46 of oxide is deposited to substantially fill trenches 40. An example material is $SiO_2$ deposited by decomposition of tetraethylorthosilicate.

Figure 11:
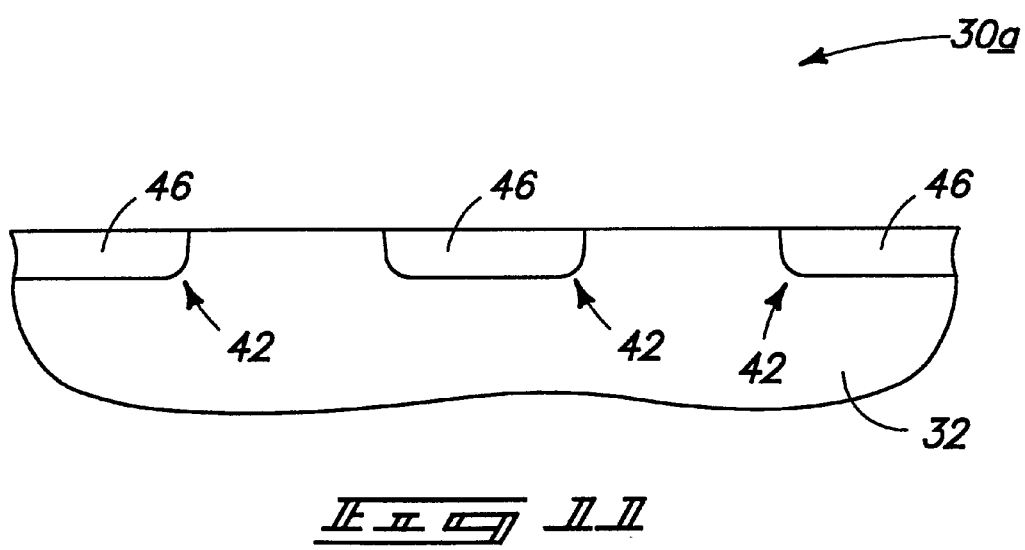
FIG. 11 is a view of the FIG. 4 wafer fragment at a processing step subsequent to that shown by FIG. 10.

Referring to FIG. 11, layer 46 is planarized to produce isolated isolation regions 46.

A combination of LOCOS and deposited oxide could also be utilized for filling the illustrated trenches.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a circuitry isolation region within a semiconductive wafer comprising:
   masking an active area region over a semiconductive wafer, the active area region being provided with an impurity doping of a first conductivity type;
   providing an impurity of a second conductivity type within the semiconductive wafer proximate the masked active area region, the providing forming an outer wafer region proximate the masked active area region which is doped with the impurity of the second conductivity type;
   substantially selectively etching second conductivity type provided semiconductive wafer material of the outer wafer region relative to first conductivity type provided semiconductive wafer material to form a trench proximate the active area region which exposes first conductivity type semiconductive wafer material within the trench through the outer wafer region, said first conductivity type semiconductive wafer material not being exposed at the start of said etching; and
   forming electrically insulating material within the trench.

2. The method of claim 1 wherein the first conductivity type is "p" and the second conductivity type is "n".

3. The method of claim 1 wherein the first conductivity type is "n" and the second conductivity type is "p".

4. The method of claim 1 wherein the second conductivity type impurity is provided by ion implanting to a dose greater than or equal to $1 \times 10^{14}$ ions/cm$^2$.

5. The method of claim 1 wherein the substantially selective etching comprises wet etching.

6. The method of claim 1 wherein the substantially selective etching comprises wet etching with a selectivity of at least 10:1.

7. The method of claim 1 wherein the substantially selective etching comprises wet etching using a solution comprising HNO$_3$ and HF in a volumetric ratio of at least 15:1 of one to the other.

8. The method of claim 1 wherein the substantially selective etching occurs while the active area region is masked by the masking.

9. The method of claim 1 wherein the substantially selective etching occurs while the active area region is unmasked by the masking.

10. The method of claim 1 wherein the substantially selective is etching occurs while the active area region is unmasked.

11. The method of claim 1 wherein the substantially selective etching occurs while the active area region is masked only by a pad oxide layer.

12. The method of claim 1 further comprising annealing the wafer prior to the substantially selective etching effective to increase selectivity in the etch than would otherwise occur under identical etching conditions without said prior annealing.

13. The method of claim 1 wherein the second conductivity type impurity is provided by ion implanting to a dose greater than or equal to $1 \times 10^{14}$ ions/cm$^2$, and further comprising annealing the wafer prior to the substantially selective etching to increase selectivity in the etch.

14. The method of claim 1 wherein the second conductivity type impurity is provided within the semiconductive wafer proximate the masked active area region after said first conductivity type impurity is provided within the active area.

15. A method of forming a circuitry isolation region within a semiconductive wafer comprising:
   defining active area and isolation area over a semiconductive wafer;
   with the active area being unmasked, etching semiconductive wafer material within the isolation area using an etch chemistry which is substantially selective relative to semiconductive wafer material within the active area to form an isolation trench proximate the active area, wherein wafer material in the active area and the wafer material in the isolation area are doped with different conductivity type impurities prior to the etching, and selectivity in the etching is achieved by choosing etching chemistry substantially selective to etch the impurity doped wafer material within the isolation area, and wherein the etching exposes active area wafer material having the different type impurity from that in the isolation area; and
   forming electrically insulating material within the trench.

16. The method of claim 15 wherein the substantially selective etching comprises wet etching.

17. The method of claim 15 wherein the substantially selective etching comprises wet etching with a selectivity of at least 10:1.

18. The method of claim 15 further comprising annealing the wafer immediately prior to the substantially selective etching effective to increase selectivity in the etch than would otherwise occur under identical etching conditions without said prior annealing.

19. A method of forming a circuitry isolation region within a semiconductive wafer comprising:
   masking an active area region over a semiconductive wafer, the active area region being doped with p-type impurity;
   providing n-type impurity dopant within the semiconductive wafer proximate the masked active area region, the providing forming an outer wafer region proximate the masked active area region which is doped with the n-type impurity;
   substantially selectively wet etching the n-type impurity doped semiconductive wafer material of the outer wafer region relative to the p-type impurity doped semiconductive wafer material within the active area region to form a trench proximate the active area region which exposes p-type impurity semiconductive wafer material within the trench through the outer wafer region, said p-type doped active area region not being exposed at the start of said etching; and
   forming electrically insulating material within the trench.

20. The method of claim 19 wherein the substantially selective wet etching comprises etching with a selectivity of at least 10:1.

21. The method of claim 19 wherein the substantially selective wet etching comprises using a solution comprising HNO$_3$ and, HF in a volumetric ratio of at least 15:1 of HNO$_3$ to HF.

22. The method of claim 19 wherein the substantially selective wet etching occurs while the active area region is masked by the masking.

23. The method of claim 19 wherein the substantially selective wet etching occurs while the active area region is unmasked by the masking.

24. The method of claim 19 wherein the substantially selective wet etching occurs while the active area region is unmasked.

25. The method of claim 19 wherein the substantially selective etching occurs while the active area region is masked only by a pad oxide layer.

26. The method of claim 19 further comprising annealing the wafer prior to the substantially selective wet etching effective to increase selectivity in the etch than would otherwise occur under identical etching conditions without said prior annealing.

27. A method of forming a circuitry isolation region within a semiconductive wafer comprising:
   masking an active area region over a semiconductive wafer, the active area region being doped with n-type impurity;
   providing p-type impurity dopant within the semiconductive wafer proximate the masked active area region;
   substantially selectively wet etching the p-type impurity doped semiconductive wafer material relative to the n-type impurity doped semiconductive wafer material within the active area region forming a trench proximate the active area region which exposes n-type impurity semiconductive wafer material within the trench; and
   forming electrically insulating material within the trench.

28. The method of claim 27 wherein the substantially selective wet etching comprises etching with a selectivity of at least 10:1.

29. The method of claim 27 wherein the substantially selective wet etching comprises using a solution comprising $HNO_3$ and HF in a volumetric ratio of at least 15:1 of HF to $HNO_3$.

30. The method of claim 27 wherein the substantially selective wet etching occurs while the active area region is masked by the masking.

31. The method of claim 27 wherein the substantially selective wet etching occurs while the active area region is unmasked by the masking.

32. The method of claim 27 wherein the substantially selective wet etching occurs while the active area region is unmasked.

33. The method of claim 27 wherein the substantially selective etching occurs while the active area region is masked only by a pad oxide layer.

34. The method of claim 27 further comprising annealing the wafer prior to the substantially selective wet etching to increase selectivity in the etch.

35. A method of forming a circuitry isolation region within a semiconductive wafer comprising:
   masking an active area region over a semiconductive wafer, the active area region being provided with an impurity doping of a first conductivity type;
   providing an impurity of a second conductivity type within the semiconductive wafer proximate the masked active area region;
   substantially selectively etching second conductivity type provided semiconductive wafer material relative to first conductivity type provided semiconductive wafer material forming a trench proximate the active area region which exposes first conductivity type semiconductive wafer material within the trench;
   forming electrically insulating material within the trench; and
   comprising conducting the selectively etching to remove substantially all said provided impurity of the second conductivity type.

36. The method of claim 1 being void of formation of any channel stop region prior to said forming of electrically insulating material within the trench.

37. The method of claim 15 being void of formation of any channel stop region prior to said forming of electrically insulating material within the trench.

38. A method of forming a circuitry isolation region within a semiconductive wafer comprising:
   masking an active area region over a semiconductive wafer the active area region being doped with p-type impurity;
   providing n-type impurity dopant within the semiconductive wafer proximate the masked active area region;
   substantially selectively wet etching the n-type impurity doped semiconductive wafer material relative to the p-type impurity doped semiconductive wafer material within the active area region forming a trench proximate the active area region which exposes p-type impurity semiconductive wafer material within the trench;
   forming electrically insulating material within the trench; and
   comprising conducting the selectively etching to remove substantially all said provided n-type impurity dopant.

39. The method of claim 19 being void of formation of any channel stop region prior to said forming of electrically insulating material within the trench.

40. The method of claim 27 comprising conducting the selectively etching to remove substantially all said provided p-type impurity dopant.

41. The method of claim 27 being void of formation of any channel stop region prior to said forming of electrically insulating material within the trench.

42. A method of forming a circuitry isolation region within a semiconductive wafer comprising:
   defining active area and isolation area over a semiconductive wafer;
   etching semiconductive wafer material within the isolation area using an etch chemistry which is substantially selective relative to semiconductive wafer material within the active area to form an isolation trench proximate the active area, wherein wafer material in the active area and the wafer material in the isolation area are doped with different conductivity type impurities prior to the etching, and selectivity in the etching is achieved by choosing etching chemistry substantially selective to etch the impurity doped wafer material within the isolation area, and wherein the etching exposes active area wafer material having the different type impurity from that in the isolation area;
   forming electrically insulating material within the trench; and
   comprising conducting the selective etching to remove substantially all the impurity within the isolation area.

43. A method of forming a circuitry isolation region within a semiconductive wafer comprising:
   defining active area and isolation area over a semiconductive wafer;
   etching semiconductive wafer material within the isolation area using an etch chemistry which is substantially selective relative to semiconductive wafer material within the active area to form an isolation trench proximate the active area, wherein wafer material in the active area and the wafer material in the isolation area are doped with different conductivity type impurities prior to the etching, the isolation area being impurity doped with p-type impurity, the active area being impurity doped with n-type impurity, and selectivity in the etching is achieved by choosing etching chemistry substantially selective to etch the p-type impurity doped wafer material within the isolation area, and wherein the etching exposes active area wafer material having the n-type impurity; and forming electrically insulating material within the trench.

44. The method of claim 43 wherein the substantially selective etching comprises wet etching.

45. The method of claim 43 wherein the substantially selective etching comprises wet etching with a selectivity of at least 10:1.

46. The method of claim 43 wherein the substantially selective etching occurs while the active area is masked.

47. The method of claim 43 wherein the substantially selective etching occurs while the active area is unmasked.

48. A method of forming a circuitry isolation region within a semiconductive wafer comprising:

defining active area and isolation area over a semiconductive wafer;

etching semiconductive wafer material within the isolation area using an etch chemistry which is substantially selective relative to semiconductive wafer material within the active area to form an isolation trench proximate the active area, wherein wafer material in the active area and the wafer material in the isolation area are doped with different conductivity type impurities prior to the etching, the isolation area being impurity doped with n-type impurity, the active area being impurity doped with p-type impurity, and selectivity in the etching is achieved by choosing etching chemistry substantially selective to etch the n-type impurity doped wafer material within the isolation area, and wherein the etching exposes active area wafer material having the p-type impurity; and forming electrically insulating material within the trench.

49. The method of claim 48 wherein the substantially selective etching comprises wet etching.

50. The method of claim 48 wherein the substantially selective etching comprises wet etching with a selectivity of at least 10:1.

51. The method of claim 48 wherein the substantially selective etching occurs while the active area is masked.

52. The method of claim 48 wherein the substantially selective etching occurs while the active area is unmasked.

* * * * *

UNITED STATES PATENT AND TRADEMARK OFFICE
CERTIFICATE OF CORRECTION

PATENT NO. : 6,340,624 B1
DATED : January 22, 2002
INVENTOR(S) : Trung Tri Doan et al.

It is certified that error appears in the above-identified patent and that said Letters Patent is hereby corrected as shown below:

Column 2,
Line 3, replace "which do not require S sharp" with -- which do not require sharp --
Line 47, in FIG. 5, replace "processing: step subsequent" with -- processing step subsequent --

Column 3,
Line 45, replace "layers 34 and 36;) to form" with -- layers 34 and 36) to form --
Line 52, replace "tially selective", is intended" with -- tially selective" is intended --

Column 6,
Line 54, replace "$HNO_3$ and, HF in a" with -- $HNO_3$ and HF in a --

Signed and Sealed this

Ninth Day of July, 2002

Attest:

JAMES E. ROGAN
Attesting Officer    Director of the United States Patent and Trademark Office